(12) United States Patent
Chowdhury et al.

(10) Patent No.: US 7,432,200 B2
(45) Date of Patent: Oct. 7, 2008

(54) FILLING NARROW AND HIGH ASPECT RATIO OPENINGS USING ELECTROLESS DEPOSITION

(75) Inventors: Shaestagir Chowdhury, Beaverton, OR (US); Chi-Hwa Tsang, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 57 days.

(21) Appl. No.: 11/303,560

(22) Filed: Dec. 15, 2005

(65) Prior Publication Data

US 2007/0141826 A1 Jun. 21, 2007

(51) Int. Cl.
*H01L 21/44* (2006.01)

(52) U.S. Cl. ............... 438/678; 438/700; 438/680; 257/E21.17; 257/E21.174; 257/E21.229; 257/E21.304; 257/E21.577

(58) Field of Classification Search ............. 438/678, 438/686, 687, 685, 683, 648, 650, 663, 656, 438/675, 627, 629, 680, 692, 270, 700, 238, 438/381, 637
See application file for complete search history.

(56) References Cited

U.S. PATENT DOCUMENTS

| | | | | |
|---|---|---|---|---|
| 675,146 | A * | 5/1901 | Huang et al. ............... | 428/203 |
| 5,240,497 | A * | 8/1993 | Shacham et al. ........... | 106/1.26 |
| 5,674,787 | A * | 10/1997 | Zhao et al. ................. | 438/627 |
| 5,990,021 | A * | 11/1999 | Prall et al. .................. | 438/745 |
| 6,319,822 | B1 * | 11/2001 | Chen et al. .................. | 438/637 |
| 6,589,881 | B2 * | 7/2003 | Huang et al. ................ | 438/725 |
| 6,686,288 | B1 * | 2/2004 | Prall et al. .................. | 438/706 |
| 6,812,512 | B2 * | 11/2004 | Prall et al. .................. | 257/296 |
| 6,860,944 | B2 * | 3/2005 | Ivanov et al. ............... | 118/50 |
| 6,881,437 | B2 * | 4/2005 | Ivanov et al. ............... | 427/58 |
| 6,958,547 | B2 * | 10/2005 | Dubin et al. ................ | 257/774 |
| 7,088,872 | B1 * | 8/2006 | Hsieh et al. ................ | 382/305 |

OTHER PUBLICATIONS

Valery M. Dubin et al., "Method to Fabricate Copper-Cobalt Interconnects", U.S. Appl. No. 10/943,610, filed Sep. 17, 2004, 28 pages.

* cited by examiner

*Primary Examiner*—David Nhu
(74) *Attorney, Agent, or Firm*—Kenneth A. Nelson

(57) ABSTRACT

Methods of fabricating an interconnect utilizing an electroless deposition technique, which fundamentally consists of providing a dielectric material layer having an opening extending into the dielectric material from a first surface thereof, and electrolessly depositing a conductive material within the opening. Various processing steps and structures may be utilized in the fabrication of the interconnect, which may include but is not limited to forming barrier layers, utilizing seed materials, utilizing activation materials, and treating the dielectric material to be receptive to electroless deposition.

17 Claims, 10 Drawing Sheets

FILLING NARROW AND HIGH ASPECT RATIO OPENINGS USING ELECTROLESS DEPOSITION

BACKGROUND OF THE INVENTION

1. Field of the Invention

An embodiment of the present invention relates to the fabrication of interconnect structures in microelectronic devices. In particular, embodiments of the present invention relate to utilizing electroless deposition to fill narrow and high aspect ratio openings formed in dielectric layers during the fabrication of interconnect structures.

2. State of the Art

The fabrication of microelectronic devices involves forming electronic components on microelectronic substrates, such as silicon wafers. These electronic components may include transistors, resistors, capacitors, and the like, with intermediate and overlying metallization patterns at varying levels, separated by dielectric materials, which interconnect the electrical components to form integrated circuits. The metallization patterns are generally referred to as "interconnects".

One process used to form interconnects is known as a "damascene process". In a typical damascene process, a photoresist material is patterned on a dielectric material and the dielectric material is etched through the photoresist material patterning to form a hole or a trench (hereinafter collectively referred to as "an opening" or "openings"). The photoresist material is then removed (typically by an oxygen plasma) and the opening is then filled with a conductive material (e.g., such as a metal or metal alloys). The filling of the opening may be accomplished by either physical vapor deposition, chemical vapor deposition, or electroplating, as will be understood to those skilled in the art. When the opening is a hole, the resulting filled structure is referred to herein as a "via". When the opening is a trench, the resulting filled structure is referred to herein as a "trace". The term "interconnect" is defined herein to include all interconnection components including traces and vias.

An optional barrier layer may be disposed on the dielectric material within the opening to prevent diffusion of the conductive material. Additionally, an optional seed layer may be disposed on the barrier layer, if present, or on the dielectric layer, if no barrier layer is present, to assist in the deposition of the conductive material, particularly when an electroplating deposition process is utilized.

The resulting structure is planarized, usually by a technique called chemical mechanical polish (CMP) or by an etching process, which removes the conductive material, which is not within the opening, from the surface of the dielectric material, to form the interconnect. As is understood by those skilled in the art, a variety of vias and traces may be formed in the various dielectric material layers to electrically connect to one another and/or to various electronic components. In another damascene process, known as a "dual damascene process", trenches and vias are substantially simultaneously filled with the conductive material with a single deposition.

As the density of integrated circuits within microelectronic devices continues to increase with each successive technology generation, the interconnects become smaller and their aspect ratios (i.e., the ratio of depth to width) may increase. As shown in FIGS. 16 and 17, a problem with small size and/or high aspect ratios is that a conductive material 402 can build up at an opening 404 proximate a first surface 406 of a dielectric material 408 (i.e., the "mouth" 412 of the opening 404) during deposition. An optional barrier layer 410 may also be present, as will be understood to those skilled in the art.

The build-up (illustrated within dashed circle 414) blocks the path of the deposited conductive material 402 and, as shown in FIG. 18, can result in voids 416 forming within the conductive material 402 in the opening 404 (shown in FIGS. 16 and 17). FIG. 18 illustrates an interconnect 418 formed after the conductive material 402, which is not within the opening 404 (shown in FIG. 16), from the dielectric material first surface 406. The voids 416 can have different sizes, distributions, and locations within the interconnect 418. For example, some voids 416 may be so large that they effectively break the conductive path of the interconnect 418, which may result in the failure of the microelectronic device, thereby having an immediate impact on yield. Additionally, the voids 416 may also be small, which may have an immediate impact by restricting the flow of electrons along the interconnect 418 and/or may have a negative impact on the long-term reliability of the microelectronic device.

Current conductive material deposition techniques are non-selective, relatively costly, and are susceptible to voiding, particularly with opening having widths of between about 2 and 15 nanometers with aspect ratios of between about 1 and 15. Additionally, using electroplating techniques in the filling of openings may also have issues with regard to metal corrosion due to long nucleation times, as well as bath stability and particle generation, as will be understood to those skilled in the art.

Therefore, it would be advantageous to develop techniques to effectively fill openings, while reducing or substantially eliminating void formation during the fabrication of interconnects for microelectronic devices.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Figure 1:
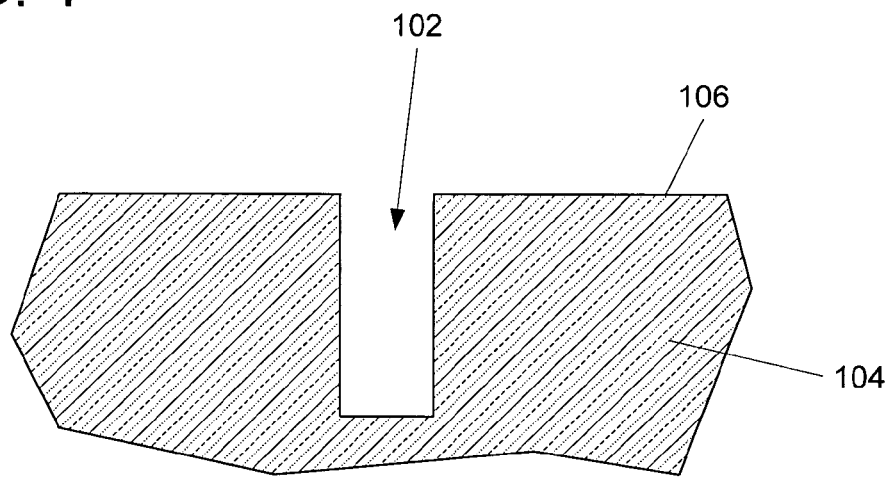
FIG. 1 illustrates a side cross-sectional view of an opening formed in a dielectric material, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Embodiments of the present invention relate to the fabrication of interconnect structures in microelectronic devices. The interconnect structures are fabricated by forming at least one opening in a dielectric material and filling the opening(s) utilizing electroless deposition.

In one embodiment of the present invention as shown in FIG. 1, an opening 102 is formed in a dielectric material layer 104, extending into the dielectric material layer 104 from a first surface 106 thereof. The dielectric material layer 104 may include, but is not limited to, silicon oxide, silicon nitride, carbon doped oxide, fluorinated silicon oxide, boron/phosphorous doped oxide, and the like. The opening 102 may be formed by any technique known in the art, including but not limited to, lithography, ion milling, laser ablation, and the like. As shown in the FIG. 2, a barrier material layer 108 may optionally be deposited in the opening 102 to substantially conformally abut the dielectric material layer 104. Such, barrier material layers 108 are used when a material which will be subsequently deposited in the opening 102 is susceptible to diffusion into the dielectric material layer 104, such as copper and copper alloys. Such diffusion can adversely affect the quality of microelectronic device through increased leakage current and/or decreased reliability between interconnects. A typical material used for the barrier material layer 108, particularly for copper interconnects, may include tantalum (Ta), titanium (Ti), tungsten (W), ruthenium (Ru), molybdenum (Mo), niobium (Nb), platinum (Pt), palladium (Pd), rhenium (Re), osmium (Os), iridium (Ir), gold (Au), rhodium (Rh), and the like, as well as nitrides, oxides, and alloys thereof. A portion of the barrier material layer 108 may also extend over and abut the dielectric material first surface 106.

Figure 3:
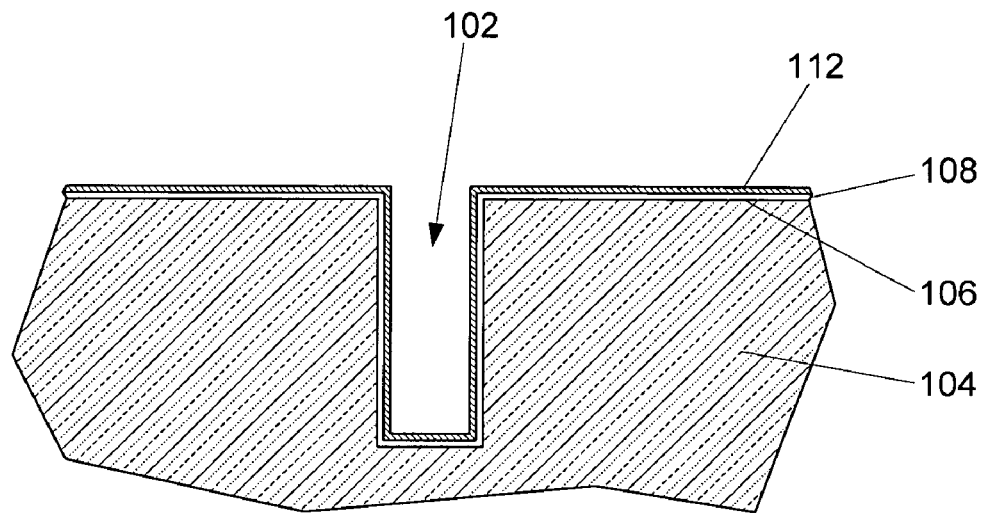
FIG. 3 illustrates a side cross-sectional view of an optional seed layer abutting the optional barrier material of FIG. 2, according to the present invention.

As shown in FIG. 3, a seed material 112 may be deposited on the barrier material layer 108. The seed material 112 may be deposited in an atomic layer deposition process or a physical vapor deposition process, such as magnetron sputtering, but is not so limited. The seed material 112 provides a nucleation site for a subsequent electroless plating process. The seed material 112 may include, but is not limited to, copper (Cu), palladium (Pd), cobalt (Co), nickel (Ni), ruthenium (Ru), platinum (Pt), alloys thereof, and the like. In one embodiment, the solution used to deposit the seed material 112 may comprise palladium chloride or silver chloride (less than about 5 gm/liter), ethylenediamine tetraacetic acid (less than about 3 gm/liter, hydrochloric acid (about 37 wt. percent), glacial acetic acid (less than about 100 ml/liter), and the balance de-ionized water.

Figure 2:
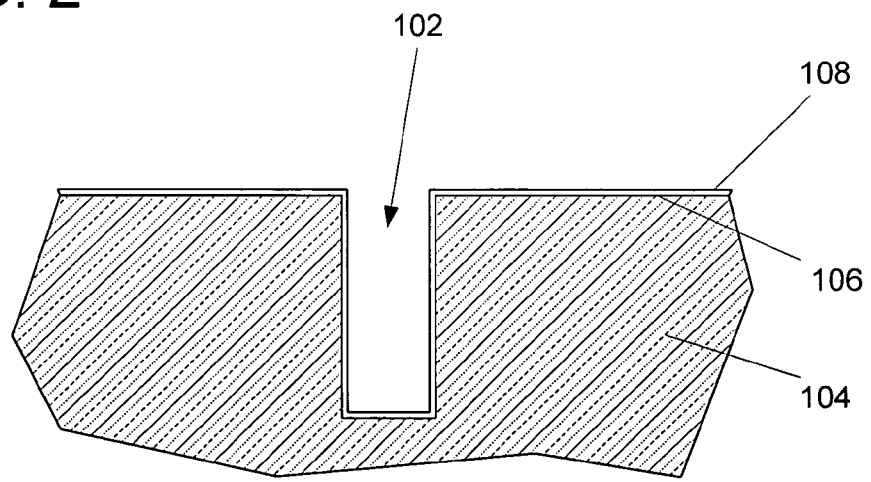
FIG. 2 illustrates a side cross-sectional view of an optional barrier material lining the opening of FIG. 1, according to the present invention.
Figure 4:
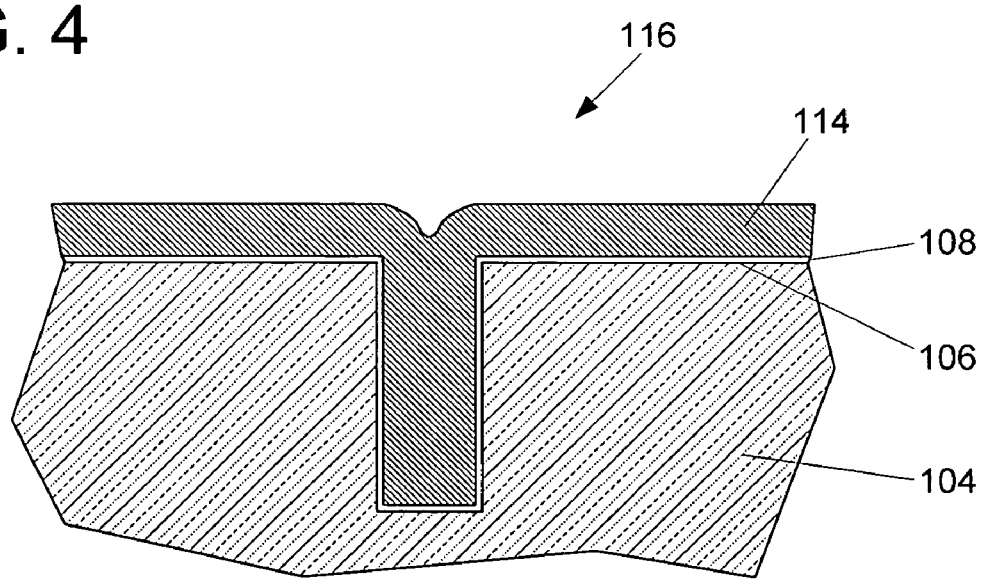
FIG. 4 illustrates a side cross-sectional view of the opening of FIG. 3 filled with a conductive material by an electroless plating process, according to the present invention.

As shown in FIG. 4, a conductive material layer 114 is electrolessly deposited within the opening 102 (see FIGS. 1-3). The electroless deposition process may include any autocatalytic (i.e., no external power supply is applied) deposition of the conductive material layer 114 through the interaction of a metal salt and a chemical reducing agent. As is known in the art, preparing or treating a surface, may be necessary in order to produce an activated surface, i.e., a surface that is receptive to the electroless deposition process. During the electroless deposition, the seed material 112 serves as the activated surface upon which the electroless deposition forms. The seed material 112 also acts as a region which controls the placement of the deposited conductive material layer 114, because the conductive material layer 114 from the electroless deposition solution only deposits on the prepared or treated surface (i.e., the seed material 112). The inherent selectivity of the electroless deposition method not only results in a substantially void free material, but also results in a higher quality conductive material layer 114 because it improves the uniformity and continuity of the electrolessly deposited conductive material layer 114.

In one embodiment, the electroless deposition solution may comprise cobalt and alloys thereof (such as cobalt alloyed with tungsten, boron, phosphorus, molybdenum, and/or the like), nickel and alloys thereof (such as nickel alloyed with tungsten, boron, phosphorus, molybdenum, and/or the like), copper, palladium, silver, gold, platinum metals and their selective alloys to fill narrow and high aspect ratio trenches and via holes. It is, of course, understood that the electroless deposition solution may also include additives (such as suppressors, i.e., polyethylene glycol, and anti-suppressors, i.e., di-sulfide) and complexing agents (such as thiosulfate and peroxodisulfate). Although a few examples of materials that may comprise the electroless deposition solution are described here, the solution may comprise other materials that serve to deposit the conductive material electrolessly. The technique of electrolessly depositing a metal or metal alloy is known to those skilled in the art, and may be performed either by immersing the substrate in an electroless deposition solution, by semi-immersion, or by spraying the electroless deposition solution onto the substrate or target (e.g., the dielectric material layer 104). It is well known to those skilled in the art that the seed material 112 may be subsumed during the electroless deposition process, such that the seed material 112 may become continuous with the conductive material layer 114, as depicted in FIG. 4.

The present invention has been found to have distinct advantages. An important aspect of electroless deposition is the ability to control the nucleation process by controlling process temperature, pH, and the compositions of the plating solution, etc., as will be understood to those skilled in the art, which allows for the filling of opens having any aspect ratio.

It has been found that electroless deposition, whether self-activated or metal activated, can be used to fill an opening without forming any neck during deposition (and consequentially virtually no voids in the interconnects) for a variety of aspect ratios, low (equal to or less than 1) or high (greater than 1). Electroless deposition is a relatively inexpensive and forms interconnects which have low resistivity and low deposition defects. Furthermore, it will be apparent that the present invention can be utilized in a variety of fabrication processes including the manufacturing of nano-scale devices and microelectronic machines.

In a specific illustration of an embodiment of the present invention, the seed material or barrier material layer is cleaned with a mild acidic etchant at a pH of between about 0 and 5 and a temperature of between about 25 and 50 degrees Celsius to remove any contaminants. A conductive material, such as cobalt, copper, and their alloys, is then plated in a self-catalytic bath or on a metal activated surface at a pH of between about 10 and 11 and a temperature of between about 60 and 80 degrees Celsius. After plating, the plated material may be post-cleaned in a deionized water/mild acidic solution to clean any residues or metal particles. Each of these steps may be performed without exposure to air, or more specific without exposure to oxygen (i.e., in inert/non-oxidizing controlled environment, such as nitrogen, helium, argon, or forming gas) to prevent oxidation of the metals or alloys.

It is, of course, understood that the electroless deposition apparatus may include variety of components and may include, but is not limited to, an integrated mega/ultra sonic, brush cleaning station and SRD (spin and rinse dryer) for cleaning and/or drying, an electroless deposition chamber (single wafer or batch, wafer face up or face down with spray or immersion or spin-on deposition methods), a wafer handling module, chemical delivery/distribution with recirculation module for electroless plating chemistries and cleaning chemistries, and an inert heating chamber for annealing from room to 600 degree Celsius.

Figure 5:
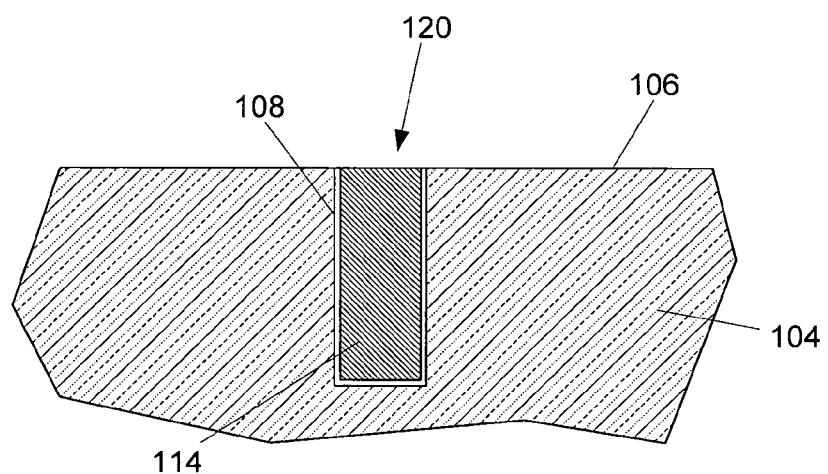
FIG. 5 illustrates a side cross-sectional view of an interconnect formed after removing excess conductive material of FIG. 4 which does not reside within the filled opening, according to the present invention.
Figure 6:
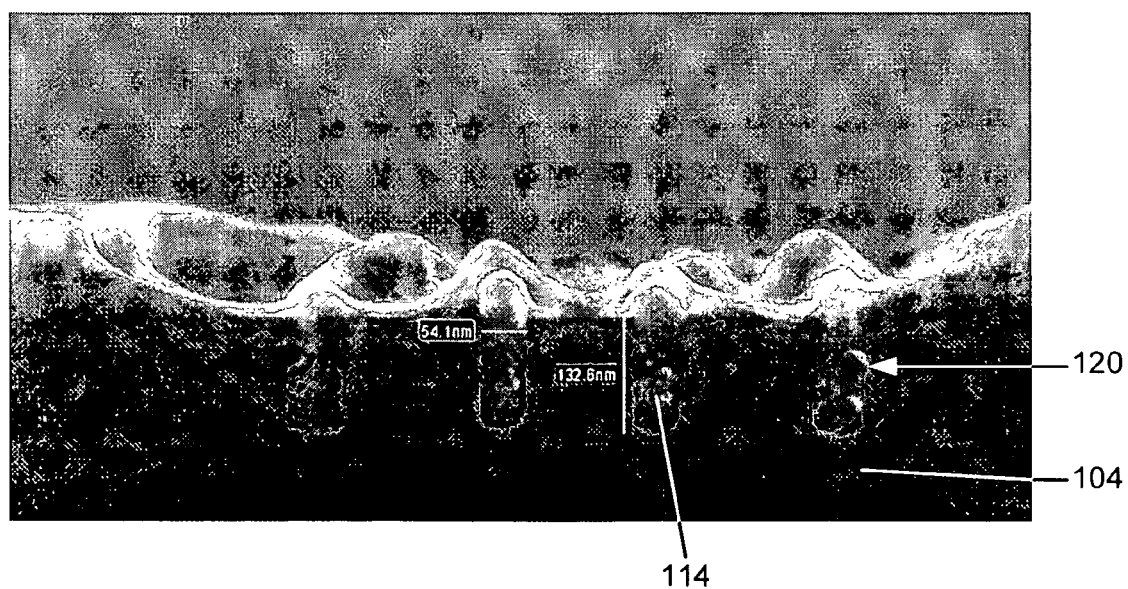
FIG. 6 is a micrograph showing filled openings having an aspect ratio of greater than about 5, according to the present invention.

As shown in FIG. 5, the resulting structure 116 of FIG. 4 is planarized, usually by a technique called chemical mechanical polish (CMP) or by an etching process, which removes the conductive material layer 114, which is not within the opening 102 (see FIGS. 1-3), from the dielectric material first surface 106 to form an interconnect 120. FIG. 6 is a cross-sectional micrograph illustrating a series of filled openings having an aspect ratio of greater than about 5, prior to planarization according to the present invention.

Figure 7:
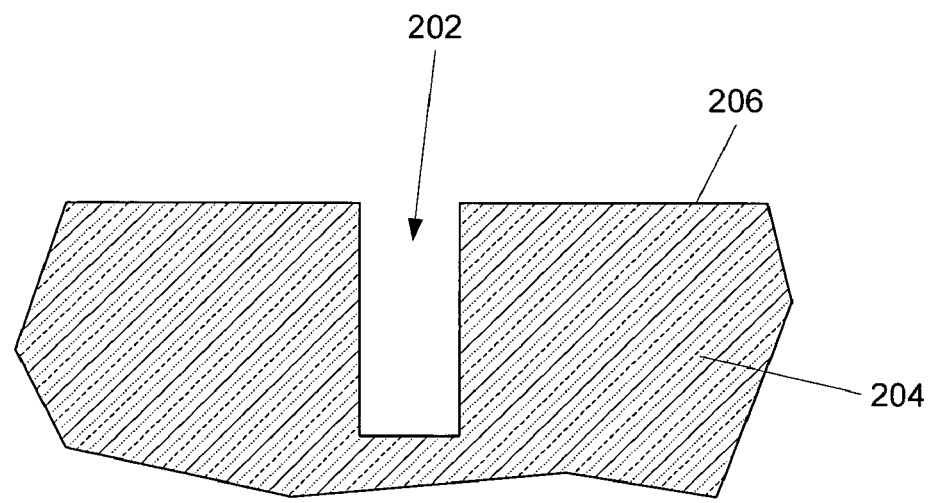
FIGS. 7-10 illustrate side cross-sectional views of forming an interconnect without the use of a seed layer, according to the present invention.
Figure 8:
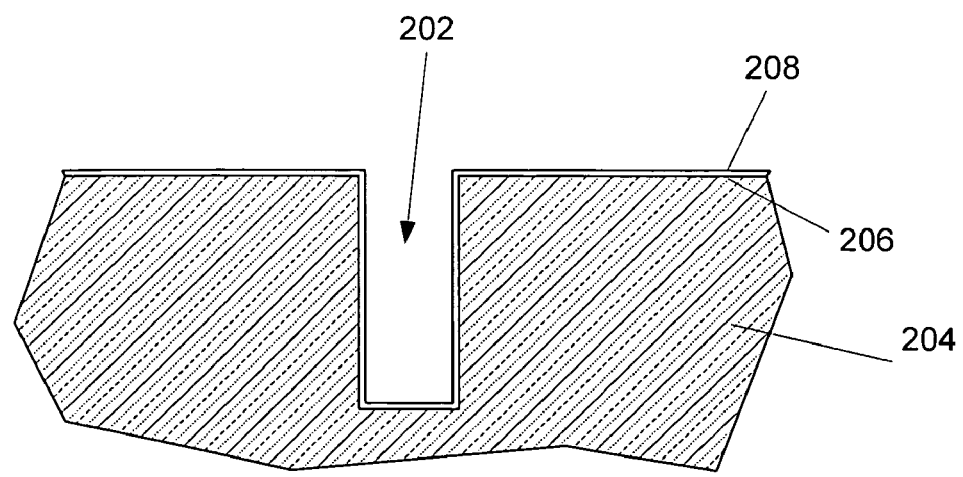

In another embodiment of the present invention, shown in FIGS. 7-10, the conductive material layer may be formed directly on an activation material. As shown in FIG. 7, an opening 202 is formed in a dielectric material layer 204, extending into the dielectric material layer 204 from a first surface 206 thereof. As shown in the FIG. 8, an activation material 208 is formed in the opening 202 to substantially conformally abut the dielectric material layer 204.

The activation material 208 may be formed by depositing a metal-containing layer, such as WN, TiN, RuN, or Ta/TaN barrier layer, less than about 100 angstroms thick, deposited by physical vapor deposition or atomic layer deposition. The activation material 208 is then, in one embodiment, pre-cleaned with a mild acidic etchant. The mild acidic etch may have a pH of between about 1 and 2 and may be applied from about 25 to 50 degrees Celsius to remove native oxides or any contaminants. The cleaned barrier layer is then sensitized with a tin chloride acidic solution, such as a solution comprising tin chloride ($SnCl_2$) (less than about 20 gram/liter), hydrochloric acid (HCl) (less than about 100 cc/liter—i.e., about 37 wt. percent, and the balance de-ionized water. After sensitization, the barrier layer is activated with palladium or silver containing chemistries.

Figure 9:
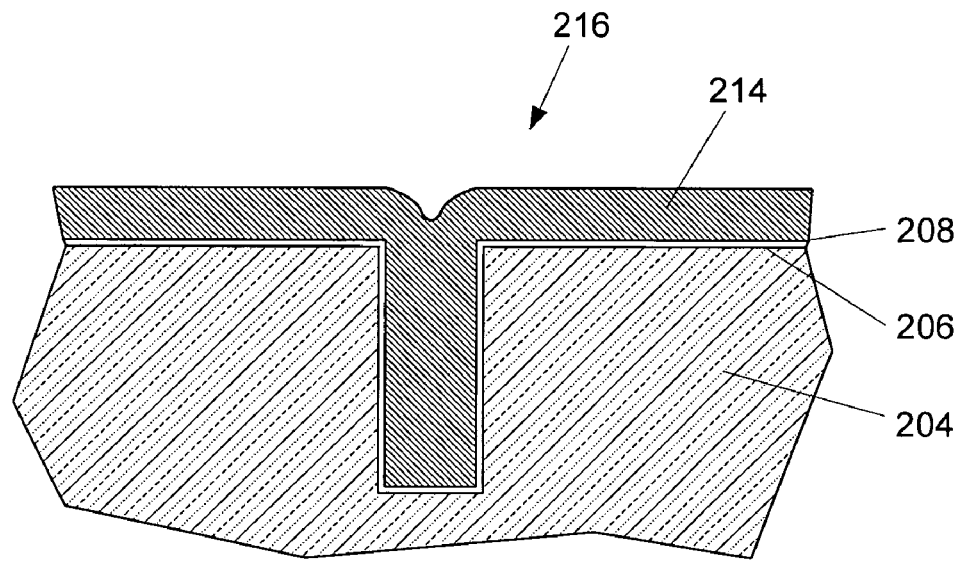

As shown in FIG. 9, a conductive material layer 214 is electrolessly deposited within the opening 202 (see FIGS. 7 and 8) in a manner discussed in previous embodiments. During the electroless deposition, the activation material 208 serves as the activated surface upon which the electroless deposition forms.

Figure 10:
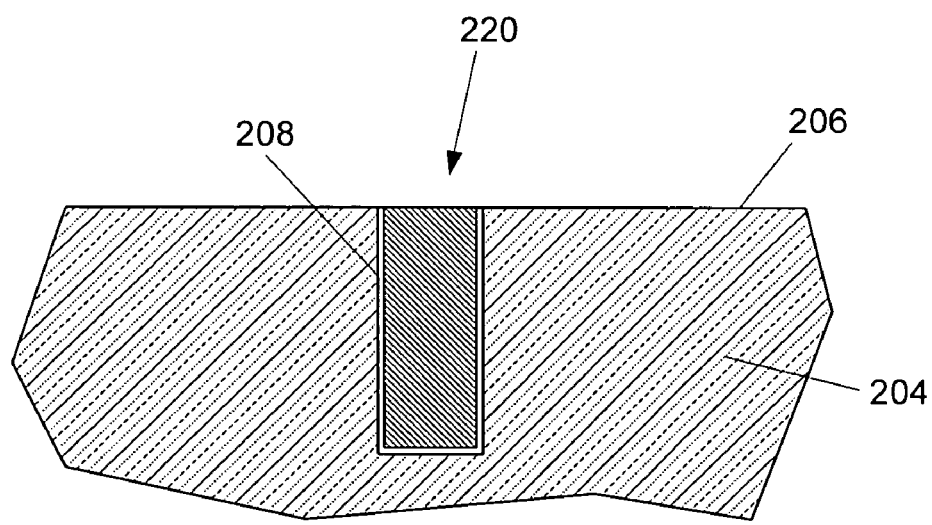

As shown in FIG. 10, the resulting structure 216 of FIG. 9 is planarized, usually by a technique called chemical mechanical polish (CMP) or by an etching process, which removes a portion of the conductive material layer 214, which is not within the opening 202 (see FIGS. 7 and 8), from the dielectric material first surface 206 to form an interconnect 220.

Figure 11:
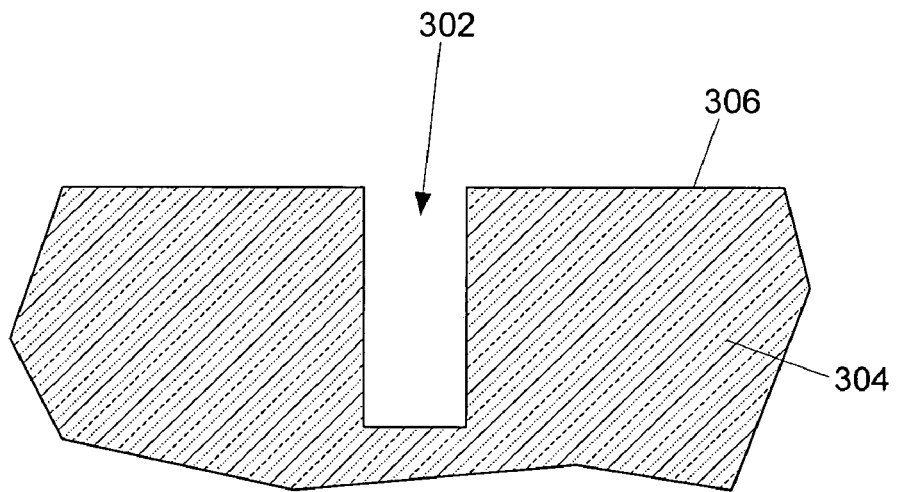
FIGS. 11-14 illustrate side cross-sectional views of forming an interconnect directly on a dielectric material, according to the present invention.
Figure 12:
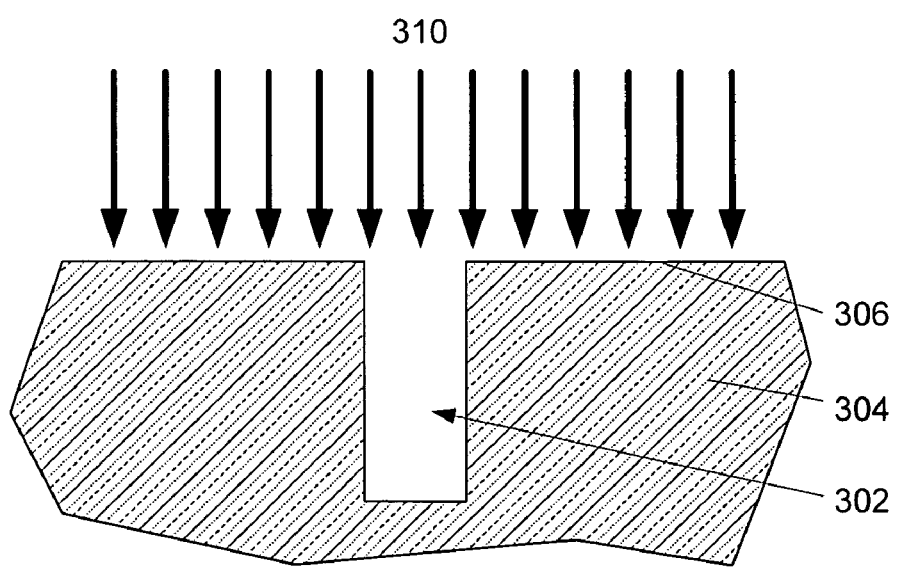

In yet another embodiment of the present invention, shown in FIGS. 11-14, the conductive material layer may be formed directly on the dielectric material. As shown in FIG. 11, an opening 302 is formed in a dielectric material 304 extending into the dielectric material 304 from a first surface 306 thereof. Dielectric materials 304 are generally not sufficiently receptive to the electroless deposition process, thus they it may be treated (activated) to be so, as illustrated by arrows 310, in FIG. 12. In one embodiment, the dielectric material 304 may be activated to be receptive to the electroless deposition process, by pre-cleaning with a mild acidic etchant. The mild acidic etch, such as citric acid, may have a pH of between about 1 and 2 and may be applied from about 25 to 50 degrees Celsius to remove any contaminants. The cleaned barrier layer may then be sensitized with a tin chloride acidic solution, such as a solution comprising tin chloride ($SnCl_2$) (less than about 20 gram/liter), hydrochloric acid (HCl) (less than about 100 cc/liter—i.e., about 37 wt. percent, and the balance de-ionized water. After sensitization, the barrier layer is activated with palladium or silver containing chemistries.

Figure 13:
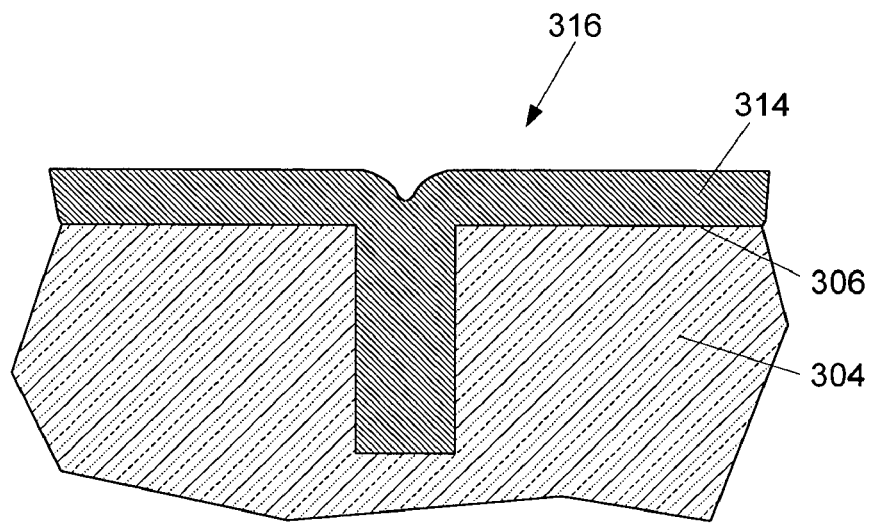
Figure 14:
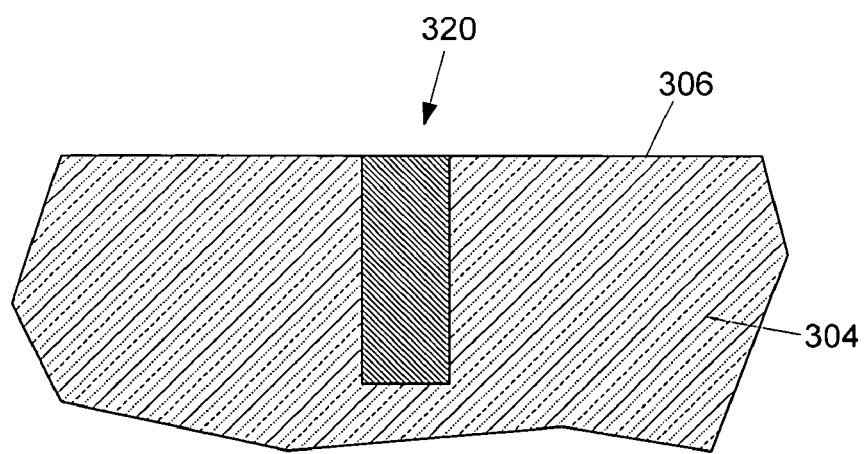

As shown in FIG. 13, a conductive material layer 314 is electrolessly deposited within the opening 302 (see FIGS. 11 and 12) in a manner discussed in previous embodiments. The treatment of the dielectric material layer 304 results in an activated surface or the dielectric material layer 304, which acts as an activated surface upon which the electroless deposition forms. As shown in FIG. 14, the resulting structure 316 of FIG. 13 is planarized, usually by a technique called chemical mechanical polish (CMP) or by an etching process, which removes a portion of the conductive material layer 314, which is not within the opening 302 (see FIGS. 11 and 12), from the dielectric material first surface 306 to form an interconnect 320.

Figure 15:
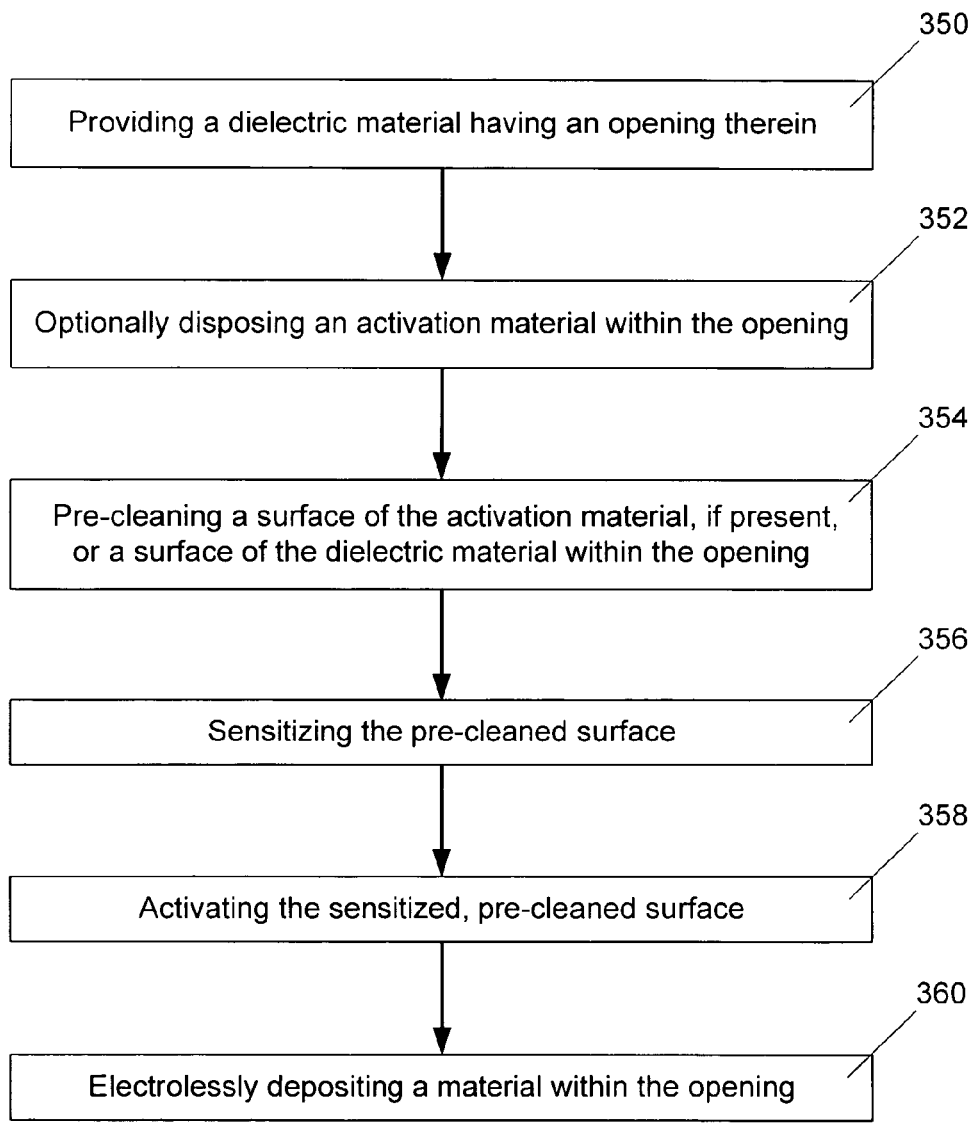
FIG. 15 illustrates a flow diagram of fabrication processes, according to the present invention.
Figure 16:
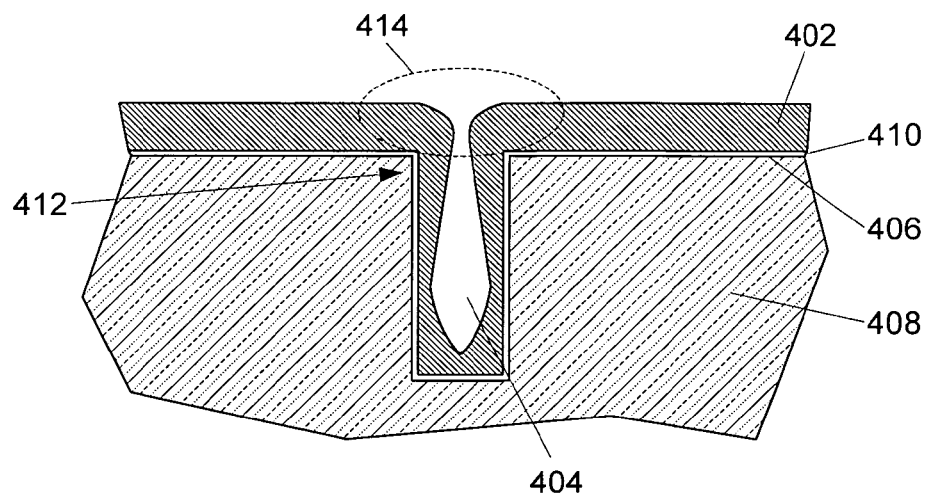
FIG. 16 illustrates a side cross-sectional view of a high aspect ratio opening having a build-up of conductive material at the mouth of an opening in a dielectric material during deposition of the conductive material, as known in the art
Figure 17:
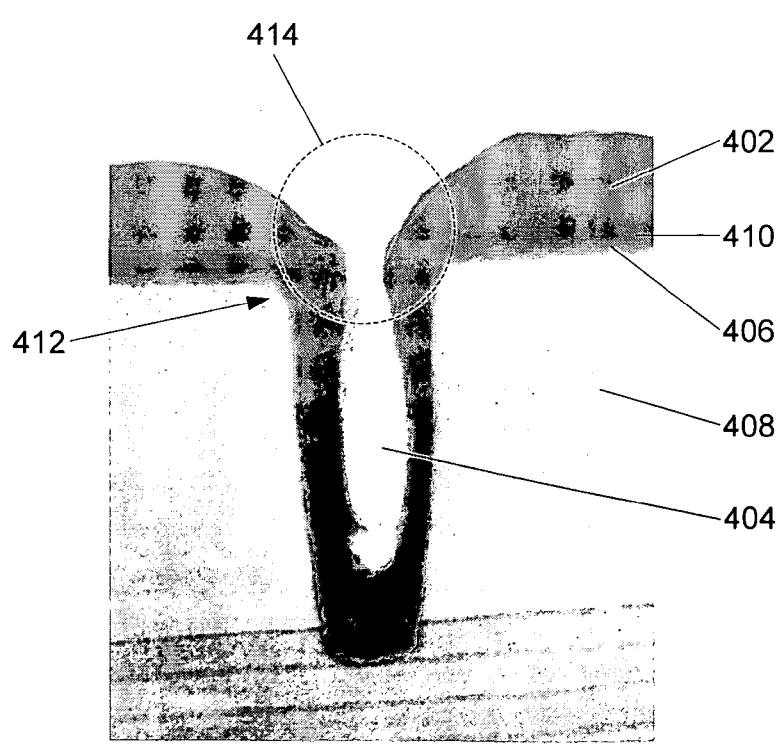
FIG. 17 is a micrograph showing the build-up of conductive material as illustrated in FIG. 16, as known in the art.
Figure 18:
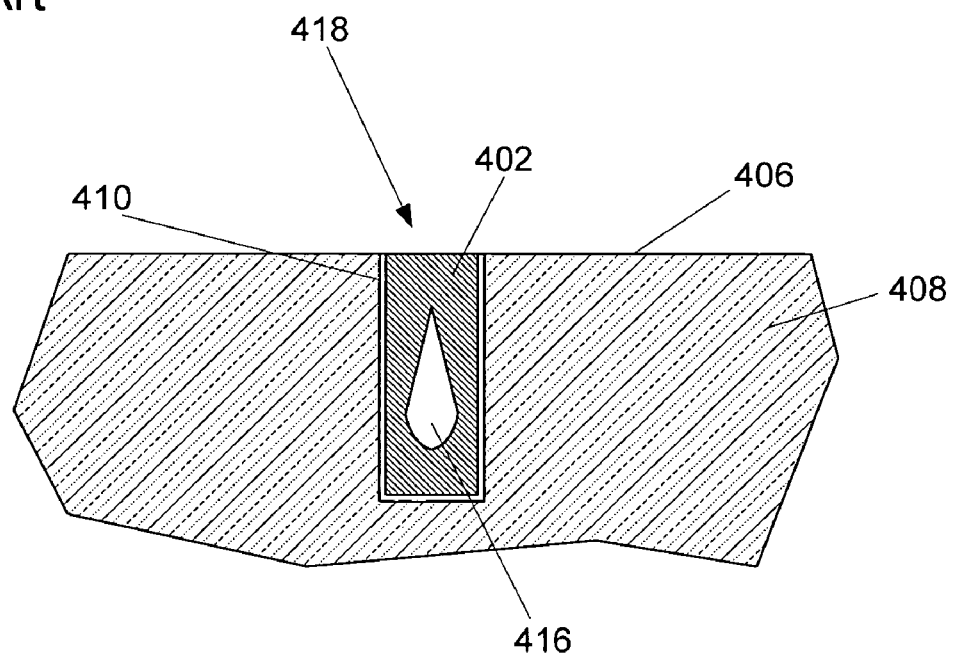
FIG. 18 illustrates a side cross-sectional view of a void within an interconnect, as known in the art.

A generalized flow diagram is shown in FIG. 15, which illustrates the general process flows discussed with regard to FIGS. 7 through 14. Step 350 comprises providing a dielectric material having an opening therein. Step 352 comprises optionally disposing an activation material within the opening. Step 354 comprises pre-cleaning a surface of the activation material, if present, or a surface of the dielectric material within the opening. Step 356 comprises sensitizing the pre-cleaned surface. Step 358 comprises activating the sensitized, pre-cleaned surface. Step 360 comprises electrolessly depositing a material within the opening.

When the present invention is utilized with palladium as a final activation or a seed material (such as reducing palladium such that is binds to a tantalum-containing surface), it has been found that virtually anything will adhere thereto, including plastics. Thus, although the description of the present invention is primarily focused on forming an interconnect with metals and their alloys, the teachings and principles of the present invention are not so limited and can be applied to any material (including plastics), any metal compounds or alloys, to any barrier materials, to nanotech devices, and the like, as will be understood to those skilled in the art. It is also understood that the present invention may be used at any metallization/interconnect layer in the fabrication of a microelectronic device from the transistor level through the packaging process.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of fabricating an interconnect, comprising:
providing a dielectric material layer having an opening extending into said dielectric material from a first surface thereof, wherein the opening has an aspect ratio of greater than 5;
disposing a metal-containing layer within said opening;
sensitizing said metal-containing layer with a tin chloride-containing solution;
activating said sensitized metal-containing layer; and
electrolessly depositing a material within said opening.

2. The method of claim 1, wherein electrolessly depositing said material comprises electrolessly depositing a conductive material.

3. The method of claim 2, wherein electrolessly depositing said conductive material comprises electrolessly depositing a metal-containing material.

4. The method of claim 3, wherein electrolessly depositing said metal-containing material comprises electrolessly depositing said metal selected from the group comprising cobalt, nickel, copper, palladium, silver, gold, platinum, and alloys thereof.

5. The method of claim 1, wherein the sensitized metal-containing layer acts as a diffusion barrier to said material within said opening.

6. The method of claim 1, further including removing contaminants from said metal-containing layer prior to sensitizing said metal-containing layer with the tin chloride-containing solution.

7. A method of fabricating an interconnect, comprising:
providing a dielectric material layer having an opening extending into said dielectric material from a first surface thereof, wherein the opening has an aspect ratio of greater than 5;
disposing a metal-containing layer within said opening;
treating said metal-containing layer with a sensitizing material;
activating said sensitized metal-containing layer by exposing said sensitized metal-containing layer to palladium; and
electrolessly depositing a material within said opening.

8. A method of fabricating an interconnect, comprising:
providing a dielectric material layer having an opening extending into said dielectric material from a first surface thereof, wherein the opening has an aspect ratio of greater than 5;
electrolessly depositing a material within said opening; and
treating dielectric material within said opening with a sensitizing material and activating said sensitized dielectric material, wherein treating said dielectric material within said opening with said sensitizing material comprises treating said dielectric material within said opening with a tin chloride-containing solution.

9. The method of claim 8, wherein electrolessly depositing said material comprises electrolessly depositing a conductive material.

10. The method of claim 9, wherein electrolessly depositing said conductive material comprises electrolessly depositing a metal-containing material.

11. The method of claim 10, wherein electrolessly depositing said metal-containing material comprises electrolessly depositing said metal selected from the group comprising cobalt, nickel, copper, palladium, silver, gold, platinum, and alloys thereof.

12. The method of claim 8, further including removing contaminants from said dielectric material within said opening prior to treating said dielectric material within said opening with said sensitizing material.

13. A method of fabricating an interconnect, comprising:
providing a dielectric material layer having an opening extending into said dielectric material from a first surface thereof, wherein the opening has an aspect ratio of greater than 5;
electrolessly depositing a material within said opening; and
treating dielectric material within said opening with a sensitizing material and activating said sensitized dielectric material, wherein activating said sensitized dielectric material comprises exposing said sensitized dielectric material to palladium.

14. The method of claim 13, wherein electrolessly depositing said material comprises electrolessly depositing a conductive material.

15. The method of claim 14, wherein electrolessly depositing said conductive material comprises electrolessly depositing a metal-containing material.

16. The method of claim 15, wherein electrolessly depositing said metal-containing material comprises electrolessly depositing said metal selected from the group comprising cobalt, nickel, copper, palladium, silver, gold, platinum, and alloys thereof.

17. The method of claim 13, further including removing contaminants from said dielectric material within said opening prior to treating said dielectric material within said opening with said sensitizing material.

* * * * *